(12) United States Patent  
Perner

(10) Patent No.: US 6,587,384 B2  
(45) Date of Patent: Jul. 1, 2003

(54) MULTI-FUNCTION SERIAL I/O CIRCUIT

(75) Inventor: Frederick A Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/839,012

(22) Filed: Apr. 21, 2001

(65) Prior Publication Data

US 2002/0154536 A1 Oct. 24, 2002

(51) Int. Cl.[7] .................................................. G11C 7/00
(52) U.S. Cl. ..................... 365/189.05; 365/158; 365/221
(58) Field of Search ..................... 365/189.05, 158, 365/221, 189.01

(56) References Cited

U.S. PATENT DOCUMENTS

| | | | | |
|---|---|---|---|---|
| 4,495,629 A | * | 1/1985 | Zasio et al. ............... 327/202 |
| 5,015,875 A | * | 5/1991 | Giles et al. ................. 326/14 |
| 5,325,511 A | * | 6/1994 | Collines et al. ............. 711/128 |
| H1796 H | * | 7/1999 | Srivatsa et al. ............. 327/215 |
| 5,999,023 A | * | 12/1999 | Kim ........................... 327/144 |
| 6,108,244 A | * | 8/2000 | Lee et al. ............... 365/189.05 |
| 6,188,615 B1 | * | 2/2001 | Perner et al. ............... 365/100 |
| 6,215,704 B1 | * | 4/2001 | Shimizu ................ 365/189.02 |
| 6,256,224 B1 | * | 7/2001 | Perner et al. ............... 365/171 |
| 6,269,028 B1 | * | 7/2001 | Togami ................. 365/189.05 |
| 6,292,428 B1 | * | 9/2001 | Tomita et al. ......... 365/189.05 |

* cited by examiner

Primary Examiner—Hoai Ho

(57) ABSTRACT

An input/output (I/O) circuit of a memory device performs I/O and stores data for write-backs. The write-back data may be used for destructive read operations. The I/O circuit may also be configured to perform data balancing, write-verifies and built-in self test (BIST).

24 Claims, 3 Drawing Sheets

MULTI-FUNCTION SERIAL I/O CIRCUIT

BACKGROUND

Magnetic Random Access Memory ("MRAM") is a type of non-volatile memory that is being considered for long-term data storage. Data can be accessed much, much faster from MRAM devices than conventional long-term storage devices such as hard drives. In addition, the MRAM devices are more compact and consume less power than hard drives and other conventional long-term storage devices.

Certain MRAM devices perform destructive read operations in which values of bits are read, changed and then restored. The destructive read operations increase reliability of reading the values. However, the destructive read operations require additional circuitry for performing functions such as write-back.

Providing separate circuits for performing the write-backs is not desirable.

SUMMARY

According to one aspect of the present invention, an input/output circuit includes a first register having a first input and a first output; a second register having a second input; and a third register having a third input. The first output is coupled to the second input and the third input. The third register can store data for write-backs.

Other aspects and advantages of the present invention will become apparent from the following detailed description, taken in conjunction with the accompanying drawings, illustrating by way of example the principles of the invention.

DETAILED DESCRIPTION

Figure 1:
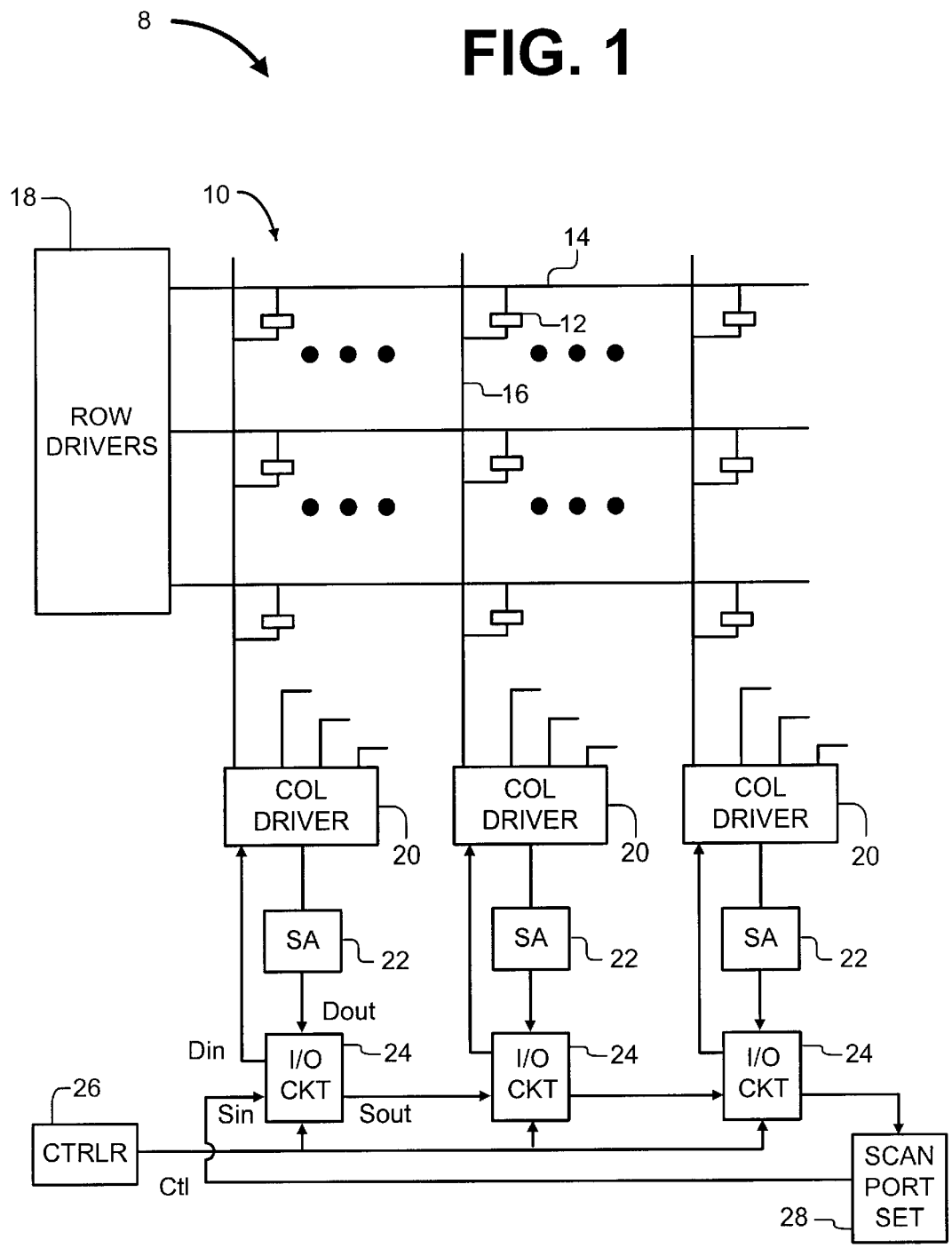
FIG. 1 is an illustration of a random access memory device including a plurality of multi-function I/O circuits.

As shown in the drawings for purposes of illustration, the present invention is embodied in an MRAM device including a plurality of multi-function input/output (I/O) circuits. Each I/O circuit can perform or support the following functions: serial I/O, built-in self test (BIST), write-back, write-verify and data balancing. Not much larger than circuits that perform serial I/O only, the multi-function I/O circuits are especially useful for random access memory devices that perform destructive read operations.

Reference is made to FIG. 1, which illustrates an MRAM device 8 including an array 10 of memory cells 12. Traces functioning as word lines 14 extend along rows of the memory cells 12, and traces functioning as bit lines 16 extend along columns of the memory cells 12. Each memory cell 12 is located at a cross point of a word line 14 and bit line 16. Only a relatively small number of memory cells 12 is shown to simplify the description of the device 8. In practice, the array 10 may be of any size.

The device 8 includes row drivers 18 for applying appropriate potentials to selected word lines 14 during read operations and supplying write currents to selected word lines 14 during write operations. The device 8 includes column drivers 20 for supplying write currents to selected bit lines 16 during write operations, and connecting selected bit lines 16 to sense amplifiers 22 during read operations (a selected memory cell 12 lies at the cross point of a selected word line 14 and a selected bit line 16). The sense amplifiers 22 read the resistance states of the selected cells 12 to determine the logic values stored in the selected memory cells 12.

The sense amplifiers 22 perform destructive read operations. A triple-sample destructive read operation, for instance, involves sensing the resistance state of the selected memory cell 12, writing a logic '1' to the selected memory cell 12 and sensing the resistance state, writing a logic '0' to the selected memory cell 12 and sensing the resistance state, and comparing all three sensed resistance states to determine whether the original resistance state corresponded to a logic '1' or a logic '0'. A third write—a write-back—is then performed, in which the original resistance state of the selected memory cell 12 is restored. If a logic '1' was determined a logic '1' is written back to the selected memory cell 12; if a logic '0', was determined a logic '0' is written back to the selected memory cell 12. An example of a triple-sample destructive read operation can be found in assignee's U.S. Pat. No. 6,188,615.

The resistance states of a number m of memory cells 12 may be sensed simultaneously. For example, a first column slice of k contiguous bit lines 16 is multiplexed into a first sense amplifier 22, a second column slice of k contiguous bit lines 16 is multiplexed into a second sense amplifier 22, and so on until an $M^{th}$ column slice of k bits is multiplexed into an $M^{th}$ sense amplifier 22 (only three column slices are shown in FIG. 1). A total of M bits may be sensed in parallel by operating all M sense amplifiers 22 simultaneously.

The device 8 further includes a multi-function I/O circuit 24 for each column slice. Each I/O circuit 24 has a first input (Sin), a second input (Dout), a first output (Sout) and a second output (Din). Each second input (Dout) is connected to the output of a corresponding sense amplifier 22, and each second output (Din) is connected to the input of a corresponding column driver 20. The first inputs (Sin) and the first outputs (Sout) of the I/O circuits 24 are serially connected to form a scan chain. The first input of the first I/O circuit 24 in the scan chain is connected to a set of scan chain ports 28, and the first output (Sout) of the last I/O circuit 24 in the scan chain is connected to the set of scan chain ports 28. Each set of scan ports 28 includes an input scan chain port and an output scan chain port.

Only a single scan chain is shown in FIG. 1. However, the device 8 may instead have multiple scan chains operating in parallel to increase I/O data bandwidth. A device 8 having four scan chains, for example, would have four sets of scan ports 28.

Data sensed by the sense amplifiers 22 is supplied to the second inputs (Dout) and stored in the I/O circuits 24. These store operations are performed in parallel. After data has been stored in the I/O circuits 24, the data is serially shifted from one I/O circuit 24 to the next (e.g., from right to left) to the output scan chain port 28.

Data to be written to the memory array 10 is supplied serially to the first I/O circuit 24 (via the input scan chain port 28). A total of M-1 shifts is performed until the data has been shifted to each of I/O circuits 24.

A controller 26 generates control signals (Ctl) for the I/O circuits 24. The control signals (Ctl) include a master control signal (Mc), a slave control signal (Sc), a data-out control signal (Doc), a data-in control signal (Dic), a test control signal (Tc), a BIST signal (Bc), and two write signals (w1 and w0b). These control signals (Ctl) are global in that they control all of the I/O circuits 24 to perform the same functions simultaneously.

In addition to performing serial I/O, the I/O circuits 24 support the destructive read operation by making data available for write-back. Each I/O circuit 24 also performs BIST, data balancing and write-verify.

If a single sense amplifier 22 and I/O circuit 24 can fit a pitch of four columns, a total of 256 sense amplifiers 22 and 256 I/O circuits 24 may be used for a 1024×1024 array 10 of memory cells 12. A total of k=4 bit lines 16 may be multiplexed into each sense amplifier 22. If 32-bit blocks are read out in parallel, the blocks may be loaded into a single scan chain having 32 I/O circuits 24; or the blocks may be loaded into four parallel scan chains each scan chain having eight I/O circuits 24; or the blocks may be loaded into eight parallel scan chains, each scan chain having four I/O circuits 24, etc. Another read operation may be performed while the results of the previous read operation are still being processed by the serial I/O operation.

Figure 2:
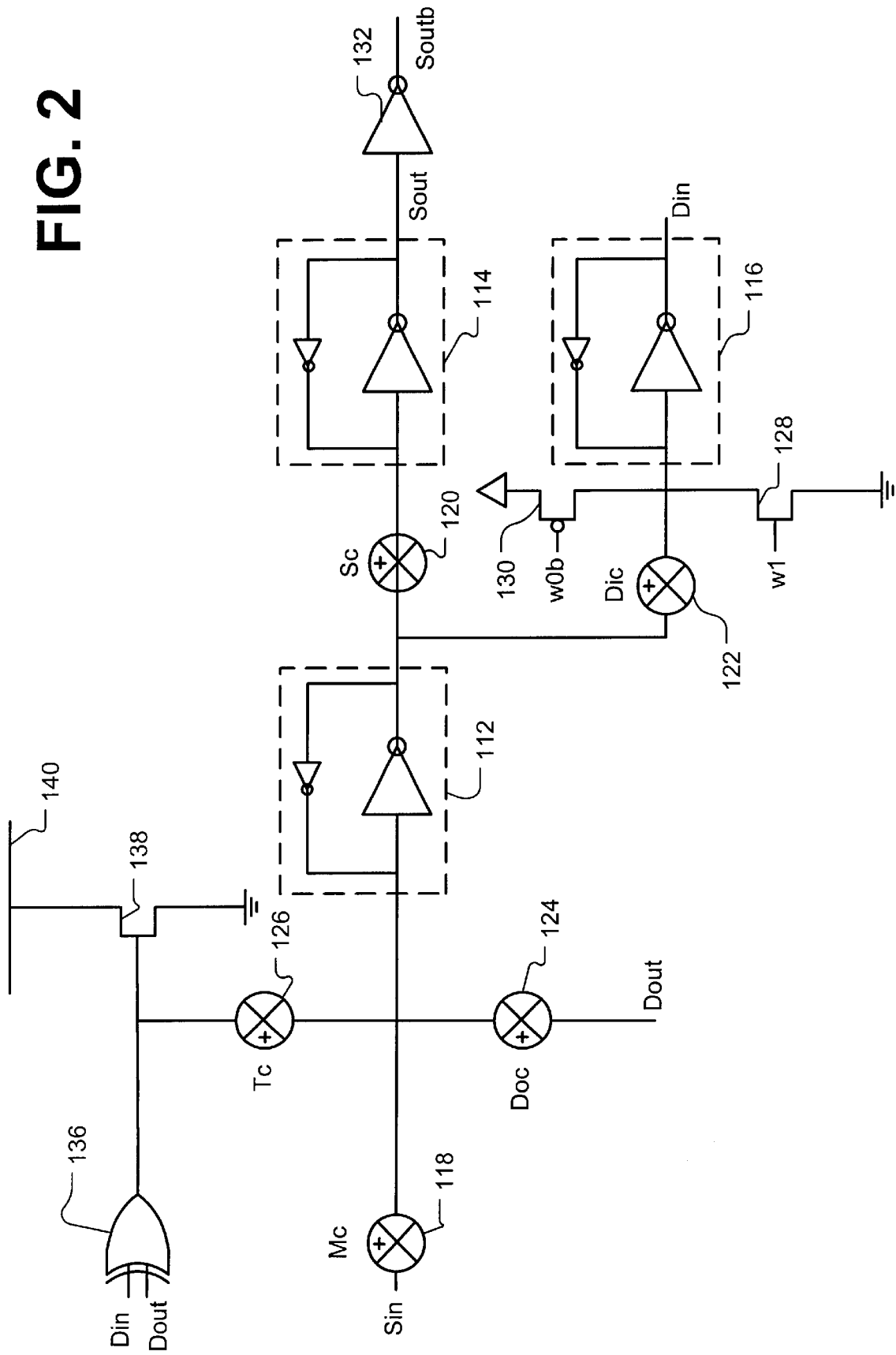
FIG. 2 is an illustration of a multi-function serial I/O circuit.

Reference is made to FIG. 2, which shows the multi-function I/O circuit 24 in greater detail. The I/O circuit 24 includes a first register (master) 112, a second register (slave) 114, and a third (data-in) register 116. The I/O circuit 24 also includes a first transmission gate 118, which couples the first input (Sin) to an input of the master 112; a second transmission gate 120, which couples an output of the master 112 to an input of the slave 114; and a third, transmission gate 122, which couples an output of the master 112 to an input of the data-in register 116. A fourth transmission gate 124 couples the output of the sense amplifier 22 to the input of the master 112.

The master control signal (Mc) is pulsed to transfer data to the master 112. The slave control signal (Sc) is pulsed to transfer data to the slave 114. The data-out control signal (Doc) is pulsed to transfer data from the sense amplifier 22 to the master 112. The data-in control signal (Dic) is pulsed to transfer data from the master 112 to the data-in register 116.

First and second transistors 128 and 130 are used to write directly to the data-in register 116. A logic '1' is written to the data-in register 116 by pulsing on the first transistor 128. The second transistor 130 remains off during a write '1' operation. A logic '0' is written to the data-in register 116 by pulsing on the second transistor 130. The first transistor 128 remains off during a write '0' operation. The second output (Din) of the data-in register 116 is supplied to the row and column drivers 18 and 20, which set the appropriate write currents.

Data to be written to the memory array 10 is supplied serially to the input scan chain port 28. With a pulse of the master control signal (Mc), a first bit of data is clocked into the master 112 of the first I/O circuit 24. With a pulse of the slave control signal (Sc), followed by a pulse of the master control signal (Mc), the data is shifted from one I/O circuit 24 to the next I/O circuit 24 in the scan chain. As the data is shifted, another bit of data is sent from the input scan chain port 28 to the first I/O circuit 24 in the scan chain. If there are a total of M I/O circuits 24 in the scan chain, then after M-1 shifts are performed, M bits of data are stored in the masters 112 of the M I/O circuits 24. Then the data-in control signal (Dic) is pulsed whereby the M bits of data are transferred in parallel to the M data-in registers 116. The outputs (Din) of the data-in registers 116 are supplied to the column drivers 20 and the row drivers 18, which set the appropriate write currents.

Figure 3:
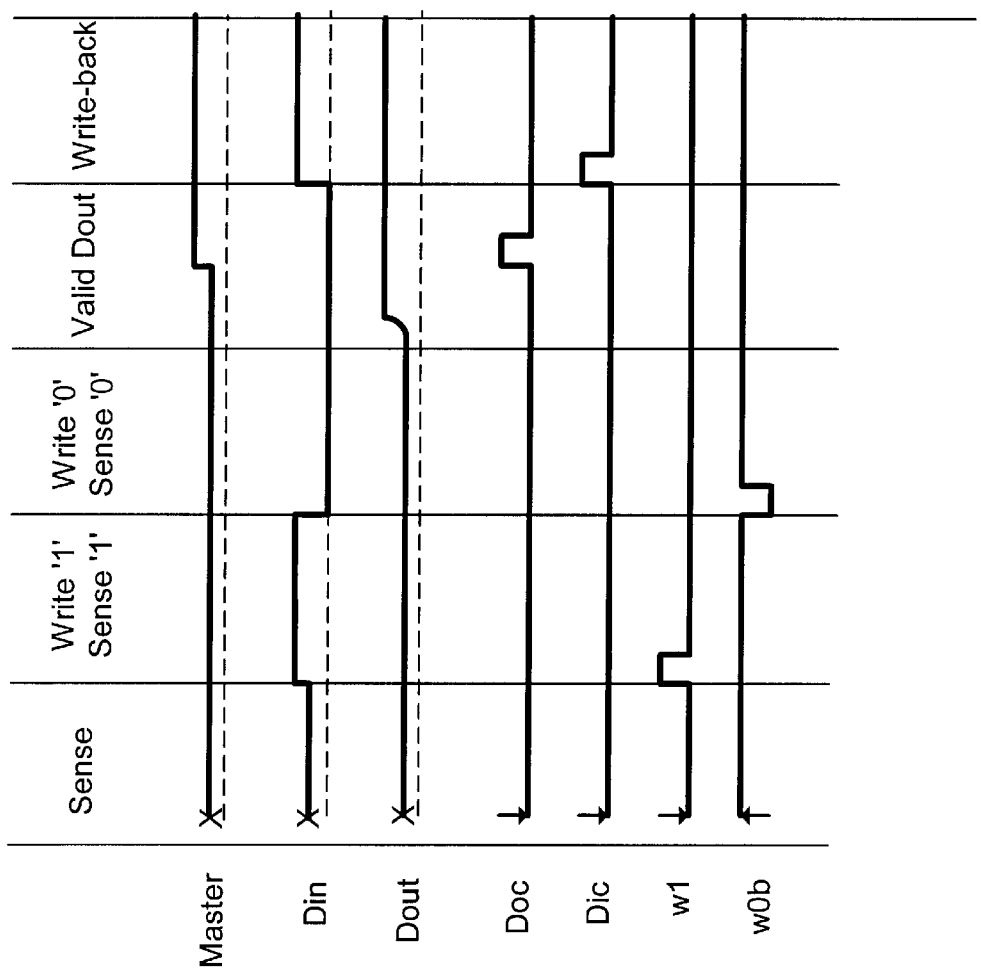
FIG. 3 is an illustration of control signals for a destructive read operation.

A triple-sample destructive read operation on a selected memory cell is illustrated in FIG. 3. This illustration indicates that a logic '1' was stored in the selected memory cell 12. An 'X' represents a "don't care" state.

During the first sense, the data-in and data-out control signals (Dic and Doc) turn off the third and fourth transmission gates 122 and 124, and the two write signals (w1 and w0b) turn off the transistors 128 and 130. During the write logic '1'/sense logic '1', the first write signal (w1) is pulsed to load a reference '1' in the data-in registers 116, followed by a sense of the reference '1'. During the write logic '0'/sense logic '0', the second write signal (w0b) is pulsed to load a reference '0' in the data-in registers 116, followed by a sense of the reference '0'.

During these three reads and two writes, the master and slave control signals (Mc and Sc) are held static so that the first and second transmission gates 118 and 120 are off to prevent noise from being generated.

Next, the data-out control signal (Doc) is pulsed, whereby the outputs of the sense amplifier 22 are stored in the master. Data is written back to the memory cells by pulsing the data-in control signal (Dic), whereby the third transmission gate 122 is turned on and the state of the master 112 is stored in the data-in register 116. The output (Din) of the data-in register 116 is supplied to the row and column drivers 18 and 20.

After the data has been read into the masters 112, the data is serially shifted. The third and fourth transmission gates 122 and 124 are held off, and the master and slave control signals (Mc and Sc) are operated in a synchronous manner to shift data from the masters 112 to the slaves (by pulsing the slave control signal) and then shifting data from the slaves 114 to the masters 112 of the next I/O circuits 24 (by pulsing the master control signal). The serial shifting in the I/O circuits is performed until the data in the first I/O circuit 24 has been shifted to the output scan chain port 28. Because the third and fourth transmission gates 122 and 124 are held open, the data that is serially shifted through the I/O circuits 24 does not affect any data that is stored in the data-in registers 116.

With the addition of a few gates, the data-in register 116 allows BIST, write-verify and data balancing to be performed. A first order data balancing effort is accomplished by adding a single inverter 132 to the output of every I/O circuit 24. The inverter 132 inverts the output (Sout) of the slave 114. The inverters 132 of the serially-connected I/O circuits 24 cause data to be inverted as it passes through each I/O circuit 24 and results in a 50/50 ratio of 1's and 0's to be actually written to the memory array when all 1's or all 0's are commanded to be written. Thus, if a '1' is written to the first I/O circuit 24, the inverter 132 of the first circuit will send a '0' to the second circuit, the inverter 132 of the second I/O circuit 24 will send a '1' to the third I/O circuit 24, the inverter 132 of the third I/O circuit 24 will send a '0' to the fourth I/O circuit 24, and so on down the scan chain. The data balancing is desirable to have the memory physically store roughly an equal number of 1's and 0's. Typical data will contain a majority of 1's or 0's (as in set all or reset all). An equal number of 1's and 0's helps balance the write power requirements and helps avoid the worst case data conditions that may adversely affect sensing reliability.

An XOR gate 136, a third transistor 138 and a fifth transmission gate 126 are used for write-verify and BIST. The third transistors 138 of all of the I/O circuits 24 are wired together to form an OR error flag 140. Each XOR gate 136 is enabled by the BIST control signal (Bc).

During BIST, a checkerboard pattern is written to the memory array 10, while storing the values in the data-in registers 116. The checkerboard pattern is read back by the sense amplifiers 22 and the XOR gates 136 compare the outputs of the sense amplifiers 22 to the values stored values in the data-in registers 116. The fifth transmission gates 126 connect the outputs of the XOR gates 136 to the scan chain to give the option of loading the scan chain with the test status of every sense amplifier 22. The test control signal (Tc) is pulsed to load the test data into the scan chain and then the scan chain may be operated to shift all of the test data to the scan chain ports 28 or error correction circuitry for a detailed analysis of the test data. The error flag 140 signals the controller 26 if an error has been detected in one of the sense amplifiers 22.

Write-verify is similar to BIST, except that data, not a test pattern, is written to the memory array 10. The write-verify operation works as follows: data is shifted from the masters 112 to the data-in registers 116 (the data-in control signal is pulsed), the outputs of the data-in registers (Din) are written to the memory array 10, and sense operations are performed while the data-out control signal (Doc) is kept low (whereby the fourth transmission gate 124 is off). Thus, results of the sense operations are not stored in the masters 112. After the sense operations have been performed, the data-in control signal (Dic) is pulsed to momentarily turn on the third transmission gates 122 to reload the data in the data-in registers 116 with the original input data from the masters 112. At this point, the original data is on Din and the sensed data is on Dout. The BIST control signal (Bc) is pulsed so that the results of the XOR compare appear at the input of the third transistor 138. If the sensed and stored data do not match (that is, if Din≠Dout), the error flag goes high to indicate a write error. If the sensed data matches the stored data (that is, if Din=Dout), then the stored data is write-verified.

The results of the write-verify test provide an indication to the system or error correction control that a write or read problem occurred when writing data, and that corrective action needs to be taken. Corrective action may include re-writing and re-verifying, or deciding to recalibrate the write circuits and/or read circuits, or marking the data location as a faulty bit, etc.

Thus disclosed is a simple I/O circuit that performs multiple functions, yet is not much larger than a circuit that performs I/O alone. Storing data for write-back is especially advantageous to devices that perform destructive read operations. However, the I/O circuit is not limited to devices that perform destructive read operations. The data balancing, write-verify and built-in self test are useful to other types of memory devices.

The invention is not limited to the specific embodiments described and illustrated above. Instead, the invention is construed according to the claims that follow.

What is claimed is:

1. An input/output circuit comprising:
   a first register having a first input and first output;
   a second register having a second input coupled to the first output; and
   a third register having a third input coupled to the first output, wherein the third register is directly responsive to the first output of the first register.

2. The circuit of claim 1, further comprising a first transmission gate for coupling the first output to the second input; and a second transmission gate for coupling the first output to the third input.

3. The circuit of claim 2, further comprising a control for causing the first and second transmission gates to shift an output of the first register into the second and third registers during a read operation, and thereafter causing the second transmission gate to isolate the third register during serial shifts.

4. The circuit of claim 1, further comprising an inverter, connected to an output of the second register, for performing data balancing.

5. The circuit of claim 1, further comprising means having a fourth input and a fifth input, the fourth input coupled to the third output of the third register, the fifth input adapted to receive sensed data, the means for comparing the sensed data to data stored in the third register.

6. The circuit of claim 5, wherein the means is configured to perform write-verify operations 7. The circuit of claim 5, wherein the means is configured to perform built-in self test.

8. The circuit of claim 1, further comprising means for writing directly to the third register.

9. A device comprising a plurality of input/output circuits, each input/output circuit as recited in claim 1; the input/output circuits having serial inputs and outputs that are connected in a scan chain.

10. An I/O circuit for a memory device, the circuit comprising:
    a first register having a first input and a first output;
    a second register having a second input;
    a first transmission gate for coupling the first output to the second input;
    a third register having a third input;
    a second transmission gate for coupling the first output to the third input; and
    a control for causing the first transmission gate to shift an output of the first register into the second register during a first mode of operation, causing the second transmission gate to shift the output of the first register into the third register during a second mode of operation, and for causing the second transmission gate to isolate the third register during a third mode of operation.

11. A random access memory device comprising:
    an array of memory cells;
    a plurality of drivers, each driver corresponding to a slice of the memory cells;
    a plurality of sense amplifiers, each sense amplifier corresponding to a slice of the memory cells; and
    a plurality of I/O circuits, each I/O circuit corresponding to a slice of the memory cells, each I/O circuit including a first register having a first output and a first input coupled to an output of the corresponding sense amplifier, a second register having a second input coupled to the first output, and a third register having a third input coupled to the first output such that the third register is directly responsive to the first output of the first register, the third register having a third output coupled to an input of the corresponding driver.

12. The device of claim 11, wherein the I/O circuits have serial inputs and outputs that are connected in a scan chain.

13. The device of claim 12, wherein each I/O circuit further includes an inverter between an output of the second register and the serial output, whereby every other I/O circuit in the scan chain stores an inverted value.

14. The device of claim 11, wherein each I/O circuit further includes a logic gate for comparing data from the corresponding sense amplifier to data stored in the third register, outputs of the logic gates being wired as an OR flag.

15. The device of claim 11, further comprising a controller for generating global control signals for the I/O circuits.

16. The device of claim 15, wherein each I/O circuit includes a first transmission gate for coupling the first output to the second input, and a second transmission gate for coupling the first output to the third input, the control signals causing the first transmission gate to shift an output of the first register into the second register during a first mode of operation, causing the second transmission gate to shift the output of the first register into the third register during a second mode of operation, and for causing the second transmission gate to isolate the third register during a third mode of operation.

17. The device of claim 15, wherein each I/O circuit further includes means, responsive to the controller, for writing directly to the third register.

18. The device of claim 11, wherein the sense amplifiers perform destructive read operations.

19. The device of claim 11, wherein the device is an MRAM device.

20. A data storage device comprising:

an array of memory cells;

a plurality of sense amplifiers, each sense amplifier corresponding to a slice of the memory cells;

a plurality of I/O circuits, each I/O circuit corresponding to a slice of the memory cells, each I/O circuit including a first register having a first output and a first input coupled to an output of the corresponding sense amplifier, a second register having a second input coupled to the first output, and a third register having a third input coupled to the first output of the first register, and a controller for controlling the I/O circuits to perform at least one of data balancing, write-verify, built-in self test, and write-back.

21. The device of claim 20, the controller controlling the I/O circuits to perform data balancing.

22. The device of claim 20, the controller controlling the I/O circuits to perform write-verify.

23. The device of claim 20, the controller controlling the I/O circuits to perform built-in self test.

24. The device of claim 20, the controller controlling the I/O circuits to perform write-back.

* * * * *